Nov. 4, 1969 YUM T. CHAN 3,477,039

VOLTAGE CONTROLLED CRYSTAL OSCILLATOR

Filed March 14, 1968

INVENTOR.
YUM T. CHAN,
BY
Paul M. Coble
ATTORNEY.

3,477,039

VOLTAGE CONTROLLED CRYSTAL OSCILLATOR

Yum T. Chan, Huntington Beach, Calif., assignor to Hughes Aircraft Company, Culver City, Calif., a corporation of Delaware Filed Mar. 14, 1968, Ser. No. 712,982
Int. Cl. H03b 5/36
U.S. Cl. 331—116 3 Claims

ABSTRACT OF THE DISCLOSURE

The disclosed voltage controlled oscillator comprises a field effect transistor and a feedback circuit connected between the drain and gate electrodes of the field effect transistor. The feedback circuit includes a 90° RC phase shift network, a variable capacitance network, and a frequency stabilizing network connected in series. The frequency stabilizing network employs a quartz crystal, a temperature compensating capacitor and an inductor, all connected in parallel. By varying a control voltage applied to the variable capacitance network, the oscillation frequency may be varied.

Figure 1:
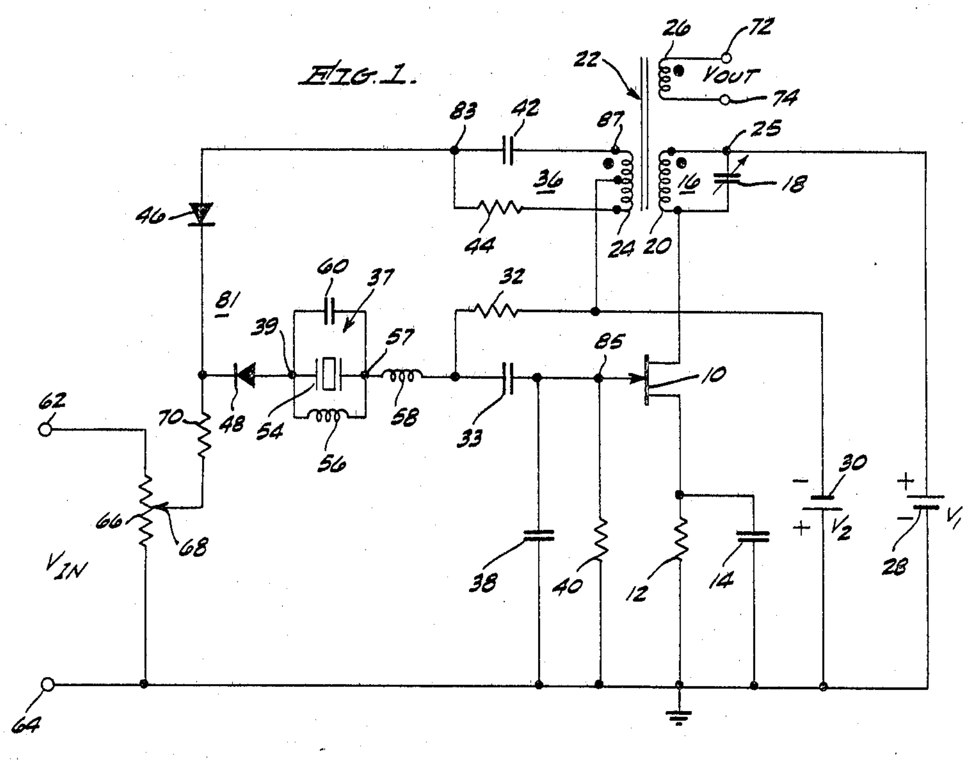

This invention relates to crystal oscillators, and more particularly it relates to a voltage controlled crystal oscillator which achieves excellent linearity and stability.

In certain applications of voltage controlled oscillators, such as radar tracking systems, it is necessary that the oscillators be extremely linear and stable over a relatively wide frequency range. The desired degree of stability can usually be achieved by employing a quartz crystal as a frequency stabilizing element. However, with such oscillators it is difficult to obtain the necessary degree of linearity over more than a narrow frequency range. Also, these oscillators often do not remain stable over long periods of time or over wide ranges of temperature.

One scheme which has been employed to extend the linearity range of a voltage controlled crystal oscillator involves mixing the crystal oscillator output frequency with a slightly different frequency from a reference oscillator to produce a difference frequency much lower than the center frequency of the crystal oscillator. The difference frequency signal is fed through a frequency multiplier to produce a net output signal at a frequency of the same order of magnitude or higher than the crystal oscillator center frequency. For a change in crystal oscillator frequency of a given number of cycles per second, the difference frequency will change by the same number of cycles per second, but by a much greater percentage than the percentage change in the crystal oscillator frequency. The net output frequency will change by the same percentage as the difference frequency; but on account of the frequency multiplication, the variation of the output signal in cycles per second is substantially greater than the cycle per second change in the difference frequency signal, and hence is also much greater than the original change in crystal oscillator frequency. Although this technique is able to extend the control range of a voltage controlled crystal oscillator, there is a tendency for spurious signals to be produced, and the stability of such an arrangement is unsatisfactory for some applications.

Accordingly, it is an object of the present invention to provide a voltage controlled crystal oscillator having exceptional linearity and stability over a relatively wide frequency range.

It is a further object of the present invention to provide a voltage controlled crystal oscillator which is simple and compact in design and highly reliable in operation.

It is a still further object of the present invention to provide a voltage controlled crystal oscillator whose frequency vs. voltage characteristics are minimally affected by aging or temperature changes.

In accordance with the objects set forth above, an oscillator circuit in accordance with the present invention includes a field effect semiconductor amplifying device having a current path and a control electrode, and a feedback circuit for deriving a signal from current in the current path and applying it to the control electrode. The feedback circuit includes means for providing a signal phase shift of essentially 90°, an electrically variable capacitance arrangement and a frequency stabilizing network coupled in series. The frequency stabilizing network includes a quartz crystal, a capacitor and an inductor connected in parallel. The inductor has an inductance value providing parallel resonance with the shunt capacitance of the crystal and the capacitor at a frequency in the vicinity of the series resonant frequency of the crystal. The semiconductor amplifying device is biased to an operating condition enabling varying current to flow through the current path at a selected frequency determined by the frequency stabilizing network and the electrically variable capacitance arrangement. A variable control voltage applied to the electrically variable capacitance arrangement enables the selected frequency to be varied.

Figure 2:
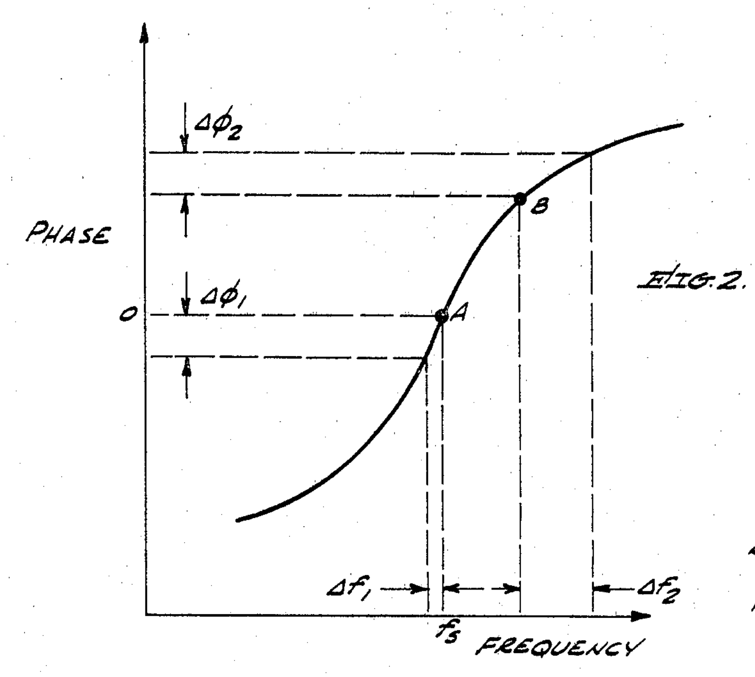

Additional objects, advantages, and characteristic features of the present invention will become readily apparent from the following detailed description of a preferred embodiment of the invention when considered in conjunction with the accompanying drawing in which:

FIG. 1 is a schematic circuit diagram illustrating a voltage controlled crystal oscillator circuit in accordance with the invention; and FIG. 2 is a graph illustrating the phase vs. frequency characteristic of a frequency determining portion of the circuit of FIG. 1.

Referring to FIG. 1 with greater particularity, the illustrative embodiment of the present invention shown therein may be seen to take the form of a Hartley-type oscillator, although it is to be understood that the principles of the present invention are also applicable to the crystal feedback oscillators having other specific configurations. The circuit comprises a semiconductor amplifying device 10, which may be a field effect transistor as illustrated. Specifically, a 2N3823 transistor manufactured by Texas Instruments, Inc., or Fairchild Camera and Instrument Corp. may be used for transistor 10; however, other field effect transistors with low stray capacitance and high transconductance characteristics may be successfully employed.

The source electrode of the transistor 10 is coupled by means of a parallel bias resistor 12 and RF bypass capacitor 14 to a level of reference potential illustrated in FIG. 1 as ground. The drain electrode of transistor 10 is connected to a parallel resonant, or tank, circuit 16 which is tuned to a frequency in the vicinity of a selected center frequency for the oscillator circuit. The tank circuit 16 comprises a variable capacitor 18 connected in parallel with the primary winding 20 of a transformer 22. Transformer 22 has a first secondary winding 24 with a center tap and a second secondary winding 26. The polarity of the signals induced in the windings 20, 24 and 26 are indicated in the conventional manner by the dots adjacent to windings 20, 24 and 26.

The tank circuit terminal 25 which is electrically remote from the drain electrode of transistor 10 is connected to the positive terminal of a power supply, illustrated as battery 28. The battery 28 provides a voltage $V_1$ which may be 6 volts, for example. Another power supply, illustrated as battery 30, provides a voltage $V_2$ which is selected in accordance with the magnitude of the input control voltage $V_{in}$. For an input control voltage $V_{in}$ of ±5 volts, $V_2$ may be approximately 7 volts, for example. A resistor 32 is connected between the negative terminal of the power supply 30 and a DC blocking capacitor 33.

Because the gate to source capacitance of the transistor 10 is readily changeable with both time and temperature, a capacitor 38 is connected between the source and the gate electrodes of transistor 10 in parallel with a bias resistor 40. The capacitor 38 provides a high magnitude of capacitance compared to the transistor gate to source capacitance; hence a change in the latter capacitance has a minimal effect on the combined capacitance of capacitor 38 and the gate to source capacitance of transistor 10.

The signal induced in the secondary winding 24 of the transformer 22 is applied to the gate electrode of the transistor 10 through a feedback path including a 90° phase shift network 36, an electrically variable capacitance arrangement 81, and a frequency stabilizing network 37.

The 90° phase shift network 36 comprises a capacitor 42 having one terminal connected to the dotted end of secondary winding 24 and the other terminal connected to a resistor 44 at point 83, the other terminal of the resistor 44 being connected to the non-dotted end of secondary winding 24. The 90° phase shift network 36 provides a current at point 83 which leads the voltage at point 87, i.e., the dotted end of secondary winding 24, by 90°. Capacitor 42 and transistor 44 are chosen to satisfy the relation $$R_{44}=\frac{1}{2\pi f C_{42}} \quad (1)$$

where $f$ is the center frequency for the oscillator circuit, $C_{42}$ is the capacitance of capacitor 42 and $R_{44}$ is the resistance of resistor 44.

The electrically variable capacitance arrangement 81 includes a pair of varactor diodes 46 and 48 connected in series in opposite polarity, with their cathodes connected together. The diodes 46 and 48 (which may be V27 or V927 varacap silicon junction diodes manufactured by TRW Semiconductors, Inc., Lawndale, Calif.), provide a capacitance versus voltage characteristic in which the capacitance decreases nonlinearly as a function of increasing voltage. In the circuit illustrated in FIG. 1, the variable capacitance arrangement 81 is connected between terminal 83 of the 90° phase shift network 36 and a terminal 39 of a frequency stabilizing network 37.

The frequency stabilizing network 37 includes a piezoelectric crystal 54 and an inductor 56 connected in parallel. The crystal 54 may be 5 mHz. quartz crystal having 0.01 pf. motional capacitance, for example. Also, in parallel with the crystal 54 is a temperature compensating capacitor 60. The capacitor 60 may be a 1 to 4 pf. N5600, negative temperature characteristic capacitor. A zero temperature characteristic capacitor (not shown) may be connected in series with the capacitor 60 in order to improve the temperature stability of the circuit.

The inductance of inductor 56 may be selected such that the resonant frequency determined by inductor 56 and the net parallel capacitance of crystal 54 and capacitor 60 is in the vicinity of the series resonant frequency of crystal 54 preferably about 5 percent to 20 percent higher than the crystal series resonant frequency. An inductor 58 is connected between terminal 57 of the frequency stabilizing network 37 and the junction between resistor 32 and capacitor 33. The inductance of inductor 58 may vary over a range from aproximately zero to a value of about 20 percent higher than the inductance of inductor 56, for example.

Input terminals 62 and 64 for the circuit are adapted to receive the input control voltage $V_{in}$, which controls the capacitance of the varactor diodes 46 and 48 to establish the desired operating frequency of the circuit. The voltage $V_{in}$ may be either a DC control voltage or a relatively low frequency AC modulating voltage. A sensitivity adjusting potentiometer 66, having a movable tap 68, is connected between the terminals 62 and 64 with the terminal 64 being connected to ground. The movable potentiometer tap 68 is connected via resistor 70 to the junction between the cathodes of diodes 46 and 48. The output voltage $V_{out}$ from the circuit, which is at a frequency determined by the magnitude of the input voltage $V_{in}$, is provided between terminals 72 and 74 which are connected to the respective ends of the transformer secondary winding 26.

In the operation of the circuit of the invention, the field effect transistor 10 is biased to a conductive condition by means of power supplies 28 and 30 and their connecting circuits with the source, drain and gate electrodes of the transistor 10. A portion of the resultant signal in the tank circuit 16 is regeneratively fed back to the gate electrode of transistor 10 via the transformer 22, the 90° phase shift network 36, variable capacitance arrangement 81 and the frequency stabilizing network 37 so that oscillation may be sustained. The oscillation frequency $f$ of the oscillator circuit is determined approximately by the series resonant frequency of the feedback loop and may be expressed as $$f \simeq \frac{1}{2\pi\sqrt{\frac{L_1C_1C_2}{C_1+C_2}}} \quad (2)$$

where $L_1$ and $C_1$ are the net series inductance and capacitance, respectively, of the frequency stabilizing network 37 and $C_2$ is the capacitance of the electrically variable capacitance arrangement 81.

When a positive input voltage $V_{in}$ is applied between terminals 62 and 64, the bias applied to the diodes 48 and 46 is altered so that the capacitance $C_2$ of the arrangement 81 decreases, thereby increasing the frequency $f$ at which the circuit oscillates. In response to a negative voltage applied between the input terminals 62 and 64, the capacitance $C_2$ of the arrangement increases, resulting in a decrease in the oscillation frequency $f$.

The phase vs. frequency characteristic of the frequency determining network which comprises variable capacitance arrangement 81, frequency stabilizing network 37, inductor 58, capacitor 33 and capacitor 38, is illustrated in FIG. 2. This frequency determining network is the most stable portion of the oscillator circuit. Maximum frequency stability may be achieved at a frequency where the phase vs. frequency characteristics of the frequency determining network has a maximum slope, $d\phi/df$ as shown at point A in FIG. 2. As may be seen from FIG. 2, at point A the frequency determining network provides zero phase shift at the frequency $f_s$ which is the series resonant frequency of the frequency determining network.

Since the phase shift over the entire feedback loop (frequency determining network, transistor 10, 90° phase shift network 36) should be zero, a phase change in one portion of the circuit must be compensated for in another portion of the circuit. Maximum frequency stability occurs at point A because a phase change $\Delta\phi_1$ in the frequency stabilizing network, which compensates for phase changes due to environmental changes or aging in other elements of the circuit, causes the minimum amount of change $\Delta f_1$ in frequency of oscillation of the circuit. If the oscillator oscillates at a frequency corresponding to a small phase slope, at point B of FIG. 2, for example, a larger frequency change $\Delta f_2$ will result for a phase change $\Delta\phi_2$ equal in magnitude to $\Delta\phi_1$. Since capacitor 38 shifts the phase of the feedback loop by minus 90°, the 90° phase shift network 36 compensates for this change by introducing a plus 90° phase shift so that the oscillator will oscillate at the series resonant frequency $f_s$.

Employment of a voltage controlled crystal oscillator as described above has resulted in the achievement of excellent linearity in frequency response over a wide range of input voltages, $V_{in}$, and environmental temperatures. For example, at a center frequency of 6000 kHz., when the temperature was varied between 0° C. and 50° C. for an input voltage $V_{in}$ equal to −5 volts, a frequency variation of only 0.2 kHz. occurred. A 0.7 kHz. frequency variation occurred for $V_{in}$ equal to +5 volts for the same temperature change.

Although the present invention has been shown and described with reference to a particular embodiment, nevertheless various changes and modifications obvious to a person skilled in the art to which the invention pertains are deemed to be within the scope and contemplation of the invention.

What is claimed is:

1. An oscillator circuit comprising: a field effect semiconductor amplifying device having a current path and a control electrode; feedback means for deriving a signal from current in said current path and applying it to said control electrode; said feedback means including a frequency stabilizing network, an electrically variable capacitance arrangement, and means for providing a signal phase shift of essentially 90° coupled in series; said frequency stabilizing network including a quartz crystal, a capacitor and an inductor connected in parallel, said inductor having an inductance value providing parallel resonance with the shunt capacitance of said crystal and said capacitor at a frequency in the vicinity of the series resonant frequency of said crystal; means for biasing said semiconductor amplifying device to an operating condition enabling varying current to flow through said current path at a selected frequency determined by said frequency stabilizing network and said electrically variable capacitance arrangement; and means for applying a control voltage to said electrically variable capacitance arrangement to vary said selected frequency.

2. An oscillator circuit comprising: a field effect transistor having a gate electrode, a drain electrode, and a source electrode; a transformer having a primary winding and a secondary winding; said primary winding having one terminal coupled to said drain electrode; a feedback path coupled between said secondary winding and said gate electrode; said feedback path including a resistor and a first capacitor connected in series across said secondary winding, and an electrically variable capacitance arrangement and a frequency stabilizing network coupled in series between the junction between said resistor and said first capacitor and said gate electrode; said electrically variable capacitance arrangement including first and second varactor diodes connected in series in opposite polarity; said frequency stabilizing network including a quartz crystal, a second capacitor, and an inductor connected in parallel; means coupled to said gate and source electrodes and to the other terminal of said primary winding for biasing said transistor to an operating condition enabling varying current to flow therethrough at a selected frequency determined by said frequency stabilizing network and said electrically variable capacitance arrangement; and means for applying a control voltage to said electrically variable capacitance arrangement to vary said selected frequency.

3. A circuit for providing an output voltage at a frequency determined by the magnitude of an input voltage, with the frequency of the output voltage being a highly linear function of the input voltage magnitude, comprising: a field effect transistor having a gate electrode, a drain electrode, and a source electrode; a transformer having a primary winding and first and second secondary windings; said primary winding having one terminal coupled to said drain electrode; a feedback path coupled between said first secondary winding and said gate electrode; said feedback path including a resistor and a first capacitor connected in series across said first secondary winding and an electrically variable capacitance arrangement and a frequency stabilizing network coupled in series between the junction between said resistor and said first capacitor and said gate electrode; said electrically variable capacitance arrangement including first and second semiconductor diodes connected in series in opposite polarity; said frequency stabilizing network including a quartz crystal, a second capacitor and an inductor connected in parallel; said inductor having an inductance value providing parallel resonance with the shunt capacitance of said crystal and said second capacitor at a frequency in the vicinity of the series resonant frequency of said crystals; means coupled to said gate and source electrodes and to the other terminal of said primary winding for biasing said transistor to an operating condition enabling varying current to flow therethrough at a selected frequency determined by said frequency stabilizing network and said electrically variable capacitance arrangement; means for applying said input voltage to said electrically variable capacitance arrangement to vary said selected frequency; a third capacitor coupled between said gate electrode and said source electrode; and means coupled to said second secondary winding for obtaining said output voltage.

References Cited

UNITED STATES PATENTS 3,358,244 12/1967 Er-Chun Ho et al. __ 331—116

FOREIGN PATENTS 1,473,273 3/1967 France.

JOHN KOMINSKI, Primary Examiner

U.S. Cl. X.R.

331—164